United States Patent [19]

Littman et al.

[11] Patent Number: 5,688,551

[45] Date of Patent: Nov. 18, 1997

[54] METHOD OF FORMING AN ORGANIC ELECTROLUMINESCENT DISPLAY PANEL

[75] Inventors: Jon Eric Littman, Honeoye Falls; Ching Wan Tang, Rochester, both of N.Y.

[73] Assignee: Eastman Kodak Company, Rochester, N.Y.

[21] Appl. No.: 648,772

[22] Filed: May 16, 1996

[51] Int. Cl.⁶ .................................................. B05D 5/06
[52] U.S. Cl. .............................. 427/64; 427/66; 427/69; 427/146; 427/561; 313/502; 428/690
[58] Field of Search ........................... 427/64, 66, 69, 427/70, 146, 561, 595, 596, 597; 313/502–506; 428/690

[56] References Cited

U.S. PATENT DOCUMENTS

| | | | |
|---|---|---|---|
| 4,015,166 | 3/1977 | Ohshima et al. | 313/505 |
| 4,588,674 | 5/1986 | Stewart et al. | 430/273 |
| 4,614,668 | 9/1986 | Topp et al. | 427/66 |
| 4,689,522 | 8/1987 | Robertson | 313/506 |
| 4,743,463 | 5/1988 | Ronn et al. | 427/53.1 |
| 4,970,196 | 11/1990 | Kim et al. | 505/1 |
| 5,487,953 | 1/1996 | Shirota et al. | 428/690 |

*Primary Examiner*—Shrive Beck
*Assistant Examiner*—Brian K. Talbot
*Attorney, Agent, or Firm*—Raymond L. Owens

[57] ABSTRACT

A method of forming a multicolor organic electroluminescent display panel is disclosed. The method uses a close-spaced deposition technique to form a separately colored organic electroluminescent medium on a substrate by transferring, patternwise, the organic electroluminescent medium from a donor sheet to the substrate.

7 Claims, 2 Drawing Sheets

FIG. 4

METHOD OF FORMING AN ORGANIC ELECTROLUMINESCENT DISPLAY PANEL

FIELD OF THE INVENTION

This invention is directed to an organic electroluminescent image display device and to a process for its fabrication.

BACKGROUND OF THE INVENTION

Scozzafava EP 349,265 (a patent application published by the European Patent Office on Jan. 3, 1990) discloses an organic electroluminescent image display device and a process for its fabrication. (Hereafter the acronym "EL" is used for electroluminescent or electroluminescence). Scozzafava discloses a glass substrate bearing a series of laterally spaced, parallel indium tin oxide anode strips. An organic EL medium overlies the anode strips. Laterally spaced, parallel cathode strips, orthogonally oriented relative to the anode strips, are formed over the organic EL medium by depositing cathode forming metal as a continuous layer followed by patterning. Patterning of the cathode layer into cathode strips is achieved by spin coating a solution of monomeric negative-working photoresist in 2-ethoxyethanol solvent. The photoresist is patternwise exposed to UV radiation to produce a pattern of crosslinked and uncrosslinked photoresist. The uncrosslinked photoresist is then removed by dipping the array in 2-ethoxyethanol for a few seconds. This removes the unexposed photoresist and uncovers areas of the cathode layer. The uncovered areas of the cathode layer are removed by dipping the array in an acid etch bath consisting of 1000:1 water:sulfuric acid solution. After producing the cathode strips by this procedure, the array is rinsed in water and spun to remove excess water. Scozzafava's method provides a means of patterning the cathode electrode and therefore useful in fabricating both monochrome or multicolor organic EL panels.

Tang et al. (U.S. Pat. No. 5,294,869) discloses a process for the fabrication of a multicolor organic EL imaging devices using a shadow masking method in which the shadow mask with an appropriate topological feature is an integral part of the device structure. This integral shadow mask method uses a glass substrate bearing a set of laterally spaced indium tin oxide anode electrodes. Upon this substrate, sets of pillars (integral shadow mask) made of insulating materials and fabricated by conventional photolithographic methods are positioned to provide a template for the subsequent deposition of the organic layers as well as the cathode electrodes. The multi-color organic EL medium is deposited and patterned by controlling the angular position of the substrate with respect to the deposition vapor stream. Likewise, the cathode electrode is deposited and patterned on top of the organic EL medium by controlling the angular relationship between the metal vapor stream and the substrate.

Although both Scozzafava and Tang et al. methods are useful in fabricating multicolor organic EL panels, they are not without difficulties. Scozzafava's method in patterning the cathode involves a photolithographic procedure which can disrupt the organic EL medium and corrode the low work function metal cathode because of the use of organic solvent and aqueous etching solution.

The Tang et al. method addresses the incompatability problem of the EL panel fabrication with the photolithographic processes and, in addition, provides a novel procedure in patterning the organic EL medium to form a multicolor EL panel. However, this method requires an integral shadow mask of multi-level topology which may be difficult to produce, and an vapor deposition process which requires certain complex geometrical arrangement between the vapor sources and the substrate.

SUMMARY OF THE INVENTION

It is an object of this invention to provide a method which improves process for the production of colored EL panels.

This object is achieved in a method of forming a multicolor organic electroluminescent display panel, comprising the steps of:

(a) forming and patterning a transparent conductive layer to provide a plurality of spaced electrodes on a transparent substrate;

(b) providing on the spaced electrodes, by close-spaced deposition, separately colored organic electroluminescent media to form colored subpixels; and (c) forming and patterning a conductive layer on the colored subpixels to provide a plurality of spaced electrodes.

Advantages

An advantage of the present invention is that a multicolor EL display can be made by a simple method wherein the colored organic EL medium can be deposited patternwise by a close-spaced deposition process onto a substrate forming the EL panel. This method does not require conventional photolithography in defining the color of individual pixels and thus avoids the incompatibility issues of the organic EL medium with photolithography processes.

Another advantage of the present invention is that it is possible to produce very high resolution organic EL panels with a pixel pitch as small as a few microns.

The processes of the invention by which the multicolor organic EL panels are fabricated offer the advantage that the EL medium can be initially deposited onto any desired pattern. Hence removal of EL medium to form the desired pattern of elements and the disadvantages attendant such procedures are entirely eliminated.

Since device feature dimensions such as layer thicknesses are frequently in sub-micrometer ranges, the drawings are scaled for ease of visualization rather than dimensional accuracy.

DESCRIPTION OF PREFERRED EMBODIMENTS

The term "display" or "display panel" is employed to designate a screen capable of electronically displaying video images or text. The term "pixel" is employed in its art recognized usage to designate an area of a display panel that can be stimulated to emit light independently of other areas. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green and blue regions of the visible spectrum and displaying images in any combination of hues. The red, green and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panel and is employed to designate any portion of a pixel which can be independently addressable to emit a specific color. For example, a blue subpixel is that portion of a pixel which can be addressed to emit blue light. In a full color display, a pixel generally comprises of three primary color subpixels, namely, blue, green, and red. The term "pitch" is used to designate the distance separating two pixels or subpixels in a display panel. Thus, a subpixel pitch means the separation between two subpixels.

Figure 1:
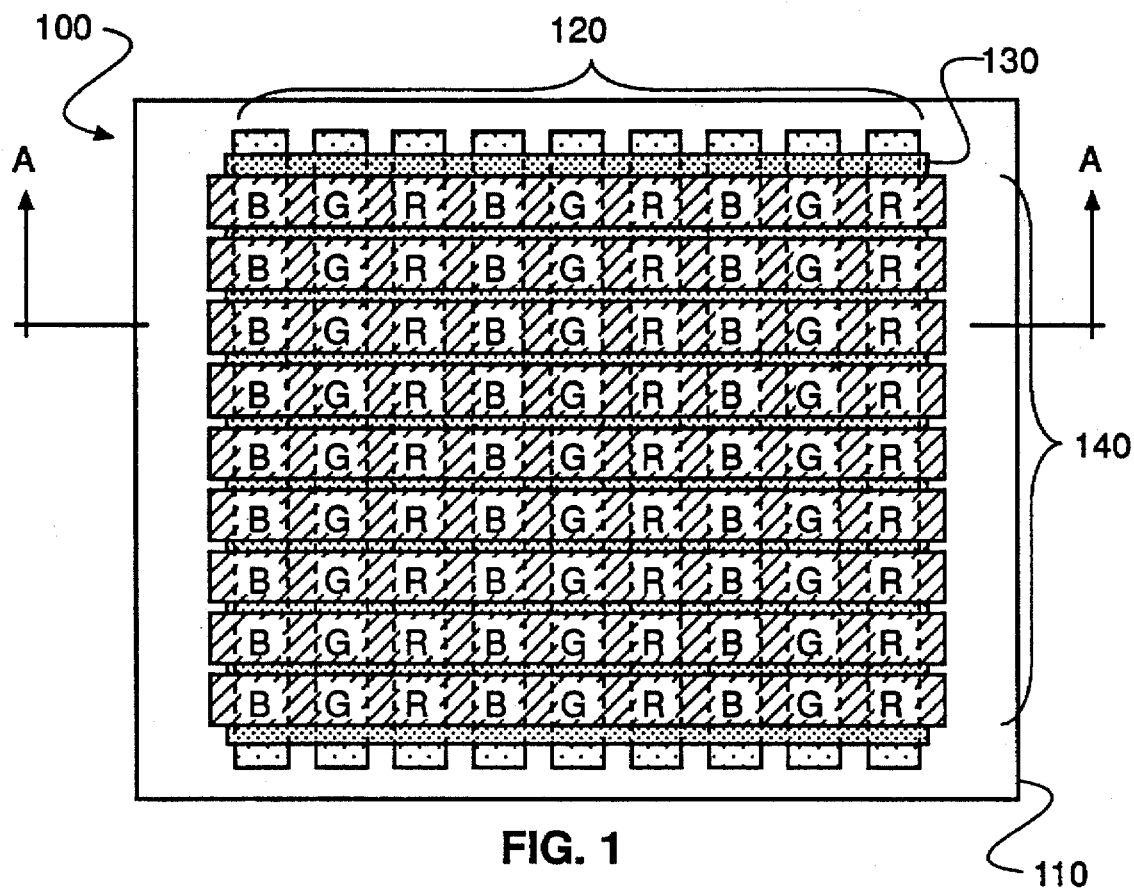
FIG. 1 is a plan view of a multicolor organic EL display panel of the invention.

Referring to FIG. 1, an organic EL device 100 is shown capable of producing a multicolor image. The upper surface of a light transmissive, electrically insulating and transparent substrate 110 is shown bearing a series of light transmissive column electrodes 120. The column electrodes are formed from a transparent layer and are laterally spaced on the substrate surface for electrical isolation. Overlying the column electrodes is an organic EL media 130. Overlying the organic EL medium is a series of row electrodes 140 arranged in parallel, laterally spaced, and electrically isolated from one another. The column and rows electrodes are shown to be orthogonal to one another forming a two-dimensional matrix of EL pixels.

The pixel structure is also illustrated in FIG. 1. Each pixel is constituted by three adjacent subpixels, labelled B,G, and R. Each subpixel is formed at the intersection of a column electrode and a row electrode and can be addressed independently to emit a specific color. For instance, the subpixel labelled B has an organic EL medium which emits blue light. Likewise, the subpixels labelled G and R have organic EL media which emit green and red light, respectively. Each pixel, therefore, has three independently addressable column electrodes and one common addressable row in this particular structure, and the EL panel as shown in FIG. 1 has three times as many column electrodes as row electrodes. This EL panel, in principle, is capable of displaying full colors, provided that the subpixels are chosen to emit the primary blue, green and red colors.

FIG. 1 describes a limited number of pixels in the EL panel. In principle, the number of pixels can be made into any size, limited only by the size of the substrate upon which the EL panel is fabricated. The pixel resolution, or the number density of pixels, can be made quite high, limited only by the method used in patterning the colored organic EL media. The close-spaced deposition used in this invention for the patterning of the organic EL medium can permit pixel resolution as high as 100 pixels per millimeter.

In operation a selected pattern of light emission from the device 100 is produced that can be seen by viewing the bottom surface of the transparent substrate 110. In a preferred mode of operation the device is stimulated to emit by sequentially stimulating one row of pixels at a time and repeating the stimulating sequence at a rate chosen so that the interval between repeated stimulation of each row is less than the detection limit of the human eye, typically less than about 1/60th of a second. The viewer sees an image formed by emission from all stimulated rows, even though the device at any instant is emitting light from only one row.

In fabricating the device 100 the first step is to provide the upper surface of the substrate 110 with the column electrodes 120 shown in FIG. 1. The most common choice for the substrate is glass because of its transparency. The most common material used for the column electrodes is indium tin oxide, chosen also because of its transparency and conductivity. The column electrodes are formed by patterning the indium tin oxide coated glass substrate using conventional photolithograhic method including photoresist application and development, followed by the etching of the indium tin oxide layer with an aqueous hydrochloric/nitric acid solution to create the desired electrode patterns. Instead of employing indium tin oxide, tin oxide or a similar electrically conductive transparent oxide, the column electrodes can be formed of thin, light transmissive layers of any of the high (e.g., greater than 4.0 eV) work function metals. Chromium and gold mixtures are particularly contemplated.

Figure 2:
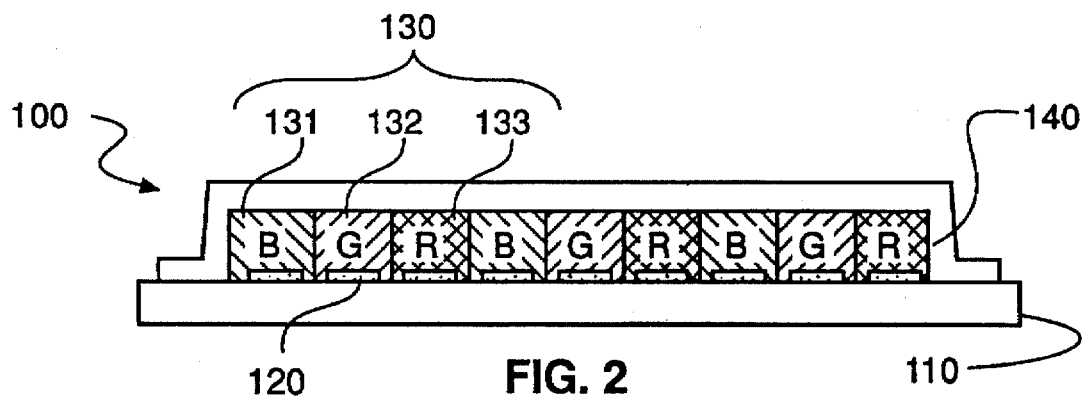
FIG. 2 is a sectional view of a multicolor organic EL display panel.

With the column electrodes in place it is now possible to form the multicolor organic EL medium and row electrodes portions of the device in their desired patterns. FIG. 2 shows a cross-section view marked A—A in FIG. 1. The EL device 100 shows a substrate 110, the column electrodes 120, the organic EL media 130 and the row electrode 140. Constituting the organic EL medium are the three primary colored EL media, 131, 132, and 133.

Figure 3A:
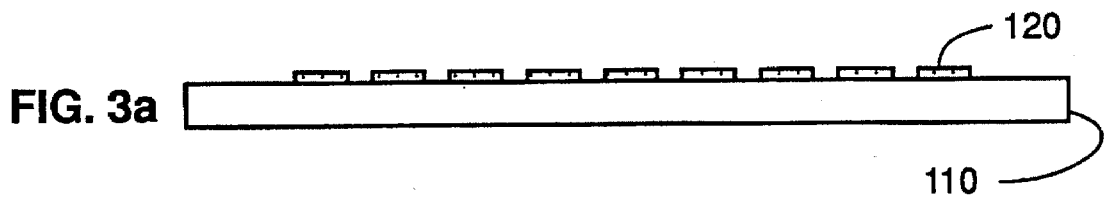
FIGS. 3a, 3b, 3c, 3d, and 3e are sectional views of a multicolor organic EL display panel at successive stages of fabrication.
Figure 3B:
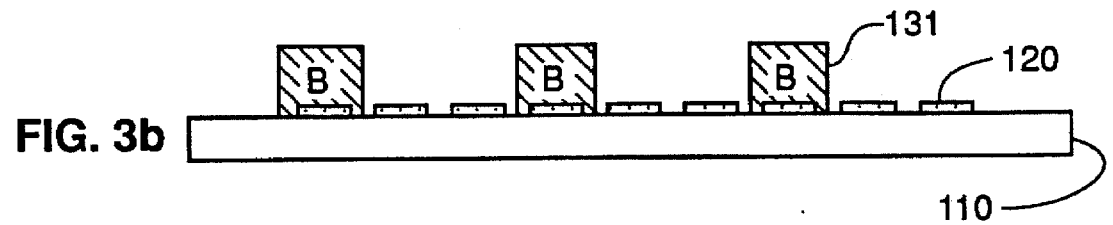
Figure 3C:
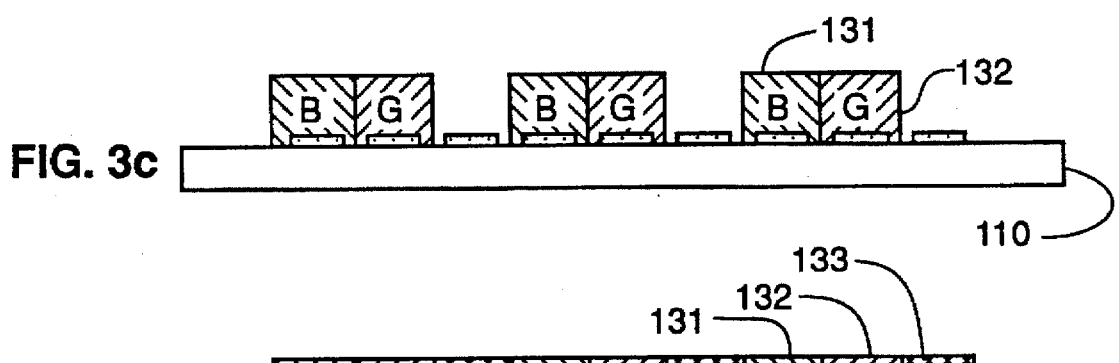
Figure 3D:
Figure 3E:
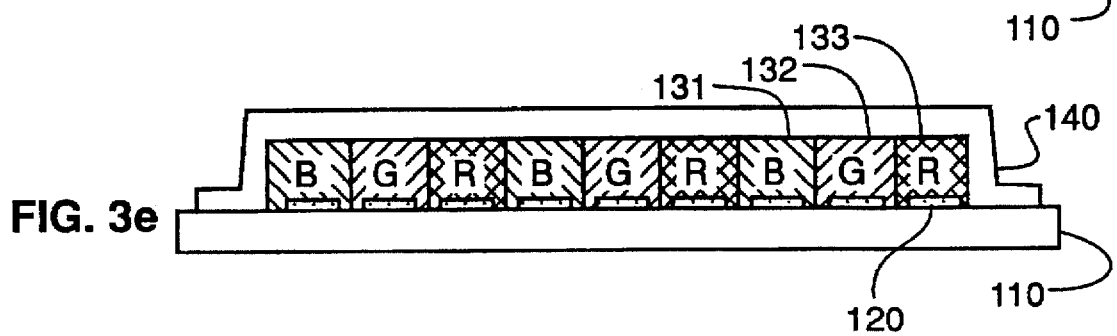

The first patterning objective is to deposit the three primary organic EL media selectively on the column electrodes. This is accomplished by the close-spaced deposition technique and the sequence of deposition is illustrated in FIGS. 3a–e. FIG. 3a shows the transparent substrate 110 with column electrodes 120. Using the close-spaced deposition method, a first primary EL medium 131 is deposited on every third column electrode to form the first primary subpixels as shown in FIG. 3b. The process is repeated and a second primary EL medium 132 is selectively deposited on the column electrodes adjacent to the first subpixels as shown in FIG. 3c. The process is repeated one more time to selectively deposit a third primary EL medium 133 on the remaining column electrodes as shown in FIG. 3d. FIG. 3e shows the completed EL panel structure with row electrodes 120.

The close-spaced deposition technique has been used exclusively in printing applications (U.S. Pat. No. 4,772, 582). In brief, the technique is used to transfer a predetermined amount of materials from a donor sheet to a receiver held in close proximity by selectively activating the donor. The activating process is usually thermal provided by focused light or localized heating elements. This close-spaced deposition technique is particularly useful for fabricating EL panel since the molecular materials constituting the organic EL media are readily sublimable at relatively low temperatures, typically less than 400° C.

In practice, the donor sheet is coated with a layer composed of the organic EL media which is to be patternwise transferred to the substrate forming the EL panel. This patternwise transfer can be accomplished most conveniently by either one of the following two methods. (1) The donor sheet contains a pre patterned the light absorbing layer. The desired organic EL media is then uniformly coated on this patterned donor sheet. The donor sheet and the EL substrate are held in close proximity (the separation between the donor sheet and the substrate during the close-spaced deposition process being in the range of direct contact between the donor sheet and the substrate to a dimension which is no greater than five times the pitch of the colored subpixel) and are correctly aligned with respect to each other by a suitable means. The patternwise transfer is effected by exposing the donor sheet to an intense blanket light source absorbed preferentially by the patterned absorbing layer on the donor sheet. (2) The donor sheet contains an unpatterned light absorbing layer. The desired organic EL media is then uniformly coated on this donor sheet. The donor sheet and the EL substrate are held in close proximity and are correctly aligned with respect to each other by a suitable means. The patternwise transfer of the EL medium from the donor to the EL substrate by sublimation is accomplished by writing on the donor absorbing layer with an intense focused beam such as a laser or a localized heating element. Thus, by using the close-spaced deposition method, patterned multicolor organic EL media can be easily generated on an EL substrate simply by repeating the transfer process several times using different donor sheets of suitable colored organic EL medium.

The patternwise transfer of the EL medium from the donor to the EL substrate can provide very high resolution panels. The resolution is determined, in part, by the separation between the donor sheet and the EL substrate which is the receiver. Other factors that determine the resolution are the nature of the absorber used on the donor sheet, the beam size of the light source used in the transfer process, and the heat dissipation pattern of the donor sheet material. It is contemplated that colored subpixel pitch on the order of a few microns or less can be achieved with this close-spaced deposition method where the donor sheet and the EL substrate receiver are held in direct contact. Where the donor sheet and the EL substrate receiver are held apart from each other, this spacing may be as large as a few times of the color subpixel pitch without compromising the patternwise transfer process.

The patterning of organic EL media using the close-spaced deposition method places a few restrictions upon the donor sheet that are not found with printing applications. Unlike printing application, the transferred EL medium needs to be relatively free of impurities for it to perform well in the EL device. Any impurity transferred from the donor other than the EL medium may negatively impact the device's efficiency and operative stability. Also, the EL medium may contain a doped layer which is a mixture of materials having different vapor pressure. To transfer such a doped layer from a donor to an EL substrate without degrading the EL medium composition may require a special donor sheet configuration. Alternatively, the EL materials forming the doped layer must be engineered to have a comparable vapor pressure so that the desired composition of the EL medium is preserved during the transfer process.

Following deposition of the organic EL media, a source is provided for the metals used for deposition of the row electrodes. For efficient organic EL devices the row electrodes require a metal or a conducting material having a low (less than 4.0 eV) work function. One or more low work function metals alone or in combination with one or more higher work function metals can be used as described by Tang et al. in commonly assigned U.S. Pat. Nos. 5,059,862 and 4,885,211. The patterning of the row electrode may be performed by a conventional photolithographic process or, preferably, by a method disclosed by Tang (commonly assigned U.S. Pat. No. 5,276,380). The disclosures of these patents are incorporated herein by reference.

In the foregoing description the organic EL media is described in its simplest possible form. That is the organic EL media can take any of the various conventional forms used to construct conventional devices containing a single organic EL media layer. More efficient operation as taught by VanSlyke et al (U.S. Pat. No. 5,061,617) is realized when the organic EL media in each active subpixel area contains superimposed layers. In efficient conventional multi-layer organic EL devices a hole injecting and transporting zone is coated over a hole injecting electrode and is in turn over-coated with an electron injecting and transporting zone, which is in turn overcoated by an electron injecting electrode.

Figure 4:
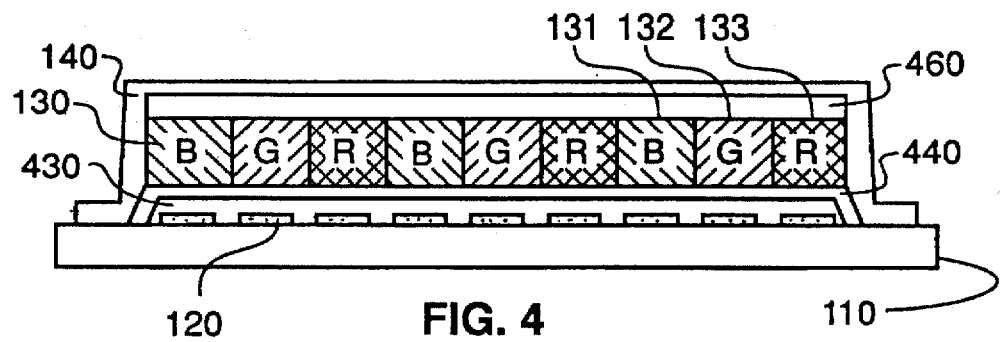
FIG. 4 is a sectional view of a multicolor organic EL display panel with a multilayered organic EL medium.

In applying the multi-layered organic EL media to the practice of this invention, it is necessary to pattern only the layer from which electroluminescence originates by the close-spaced deposition method. The other layers can be deposited uniformly and without pattern by any conventional method such as vacuum vapor deposition. FIG. 4 illustrates the construction of an organic EL device containing the EL medium which includes, in sequence, a hole injecting layer 430, a hole-transporting layer 440, a luminescent layer 130, and an electron-transporting layer 460. The substrate is 110, the column electrode is 120 and the row electrode is 140 have previously been described. All layers except the luminescent layer 130 can be deposited by conventional vacuum deposition process. The luminescent layer 130, which forms the three primary EL media 131, 132 and 133, is necessarily deposited and patterned by the close-spaced deposition disclosed in this invention.

The organic EL media is in all instances less than 1 mm and, more typically, less than 5000 Å. The individual layers of the organic EL media can exhibit thicknesses as low as 50 Å while achieving satisfactory device performance. It is generally preferred that individual layers of the organic EL media have a thickness in the range of from 100 to 2000 Å and that the overall thickness of the organic EL media be at least 1000 Å.

The organic materials and the electrode materials used in organic EL display panel of this invention can take any of the forms, such as Scozzafava, cited above and those of the following commonly assigned; Tang U.S. Pat. No. 4,356,429; VanSlyke et al U.S. Pat. No. 4,539,507; VanSlyke et al U.S. Pat. No. 4,720,432; Tang et al U.S. Pat. No. 4,885,211; Tang et al U.S. Pat. No. 4,769,292; Perry et al U.S. Pat. No. 4,950,950; Littman et al U.S. Pat. No. 5,059,861; VanSlyke U.S. Pat. No. 5,047,687; Scozzafava et al U.S. Pat. No. 5,073,446; VanSlyke et al U.S. Pat. No. 5,059,862; VanSlyke et al U.S. Pat. No. 5,061,617; the disclosures of which are here incorporated by reference.

EXAMPLES

Example 1

This example describes the construction and operating characteristics of an organic light emitting diode produced by thermal deposition techniques. This device is made by sequentially deposition three organic layers on top of an ITO coated glass substrate. In sequence from first to last, the deposited organic materials and their thickness are: copper phthalocyanine 375A, 4,4'bis[N-naphthyl)-N-phenyl amino] biphenyl 375A, and 8-hydroxyquinoline Aluminum (Alq) 600A. Then an alloy Mg:Ag (approximately 90:10 ratio by volume) 2000 A, is evaporated on top of the organic package. The exact procedure used to deposit this device has been described by VanSlyke in U.S. Pat. No. 5,061,569, Example 1E. An applied potential across the anode (ITO) and cathode (Mg:Ag) of 6.9 volts drives this device at a current level of 20 mA/cm$^2$. At this current level a radiant power level of 0.37 mW/cm$^2$ is emitted from the surface of this device, having a peak wavelength at an EL emission maximum at 540 nm. This corresponds to an EL power efficiency of 0.017 W/A.

Example 2

This example describes the preparation and operating characteristics of a device schematically equivalent to the device described in Example 1, except that the Alq layer is deposited by the close-spaced deposition technique. The copper phthalocyanine layer 375 Å and 4,4'bis[N-naphthyl)-N-phenyl amino]biphenyl layer 375 Å are deposited on top of an ITO coated glass substrate by thermal deposition as described in Example 1.

The donor sheet is prepared under high vacuum conditions, $1 \times 10^{-5}$ Torr, by alternating depositing 100 Å thick layers of chromium followed by germanium onto optically clear mica substrate at a rate of 10 Å/s for both materials. This sequence is repeated resulting in a total thickness of 400 Å. The multilayer Cr/Ge structure comprising the light absorbing layer is important and was developed with the following properties in mind:

(a) Both Cr and Ge as well as the substrate have very low vapor pressure. Under the conditions of close-spaced deposition, the Cr/Ge serves as an inert light absorber and remains physically intact, therefore only the desired organic film is transferred, free of any contamination from the donor sheet.

(b) The Cr/Ge structure provides a smooth crack free and panchromatically absorbing film with acceptable reflection characteristics.

(c) The Cr/Ge coated mica sheet provides a highly stable and reusable donor.

The Alq donor sheet is prepared by depositing a 600 Å layer of Alq by conventional thermal evaporation on top the Cr/Ge donor sheet.

To effect close-spaced deposition, this Alq donor sheet is brought into close proximity to the substrate previously coated with the copper phthalocyanine layer and the 4,4'bis [N-naphthyl)-N-phenyl amino]biphenyl layer. The donor sheet and substrate separation can be varied between contact to a distance which is small in comparison with the pixel dimension. Contact is preferable because it minimizes the divergent nature of the evaporant flux from the donor sheet and therefore can produce the highest resolution for the display panel. Under high vacuum conditions, $1 \times 10^{-5}$ Torr, light from a xenon flashlamp is focused with a quartz cylindrical lens through the back of the donor sheet onto the light absorbing layer, where upon the absorbed optical energy is converted to thermal energy and a portion of that is transferred to the evaporant layer causing it to sublime and condense onto the substrate receiver. Mg:Ag cathode is deposited on top of this organic package as in Example 1. An applied potential difference across the anode and cathode of 7.3 volts is needed to operate this device at a current density of 20 mA/cm$^2$. At this current level a radiant power density of 0.38 mW/cm$^2$ is emitted from the surface of this device. As in Example 1 the spectral distribution peaks at 540 nm. This corresponds to an EL power efficiency of 0.017 W/A.

Example 3

This example describes a device in which the EL emission is shifted from that of the Alq to one of representative of a dopant which is mixed into the Alq film. This doped Alq layer can be conveniently prepared by the close-spaced deposition procedure. The construction of this device is similar to the procedure described in Example 2. The copper phthalocyanine (375 Å) and 4,4'bis[N-naphthyl)-N-phenyl amino]biphenyl (375 Å) are sequentially deposited on top of an ITO coated substrate. Then a 400 Å layer composed of Alq doped with 1.6 mole percent of 4-(dicyanomethylene) -2-methyl-6-(p-dimethylaminostyryl)-4H-pyran is deposed by the close-spaced deposition technique using a modified donor sheet. This donor sheet is prepared under high vacuum, $1 \times 10^{-5}$ Torr, by first sequentially evaporating 100 Å layers of chromium and germanium on an optically clear mica substrate. A 400 Å thick coevaporated layer of Alq doped with 1.6 mole percent of 4-(dicyanomethylene)-2-methyl-6-(p-dimethylaminostyryl)-4H-pyran is then deposited. The donor sheet is the completed by depositing 100 Å layers of chromium and germanium on top of the organic layer. By sandwiching the doped EL medium between the metal layers, a uniformly doped layer is transferred to the substrate receiver irrespective of the vapor pressures of the host and dopant. Then a 400 Å neat film of Alq is thermally evaporated on top of the 4-(dicyanomethylene)-2-methyl-6-(p-dimethylaminostyryl)-4H-pyran doped copper phthalocyanine layer which was applied using the close-spaced deposition technique. This layer is followed by the thermal deposition of the Mg:Ag cathode. The EL spectral distribution of this device is characteristic of the dopant, 4-(dicyanomethylene)-2-methyl-6-(p-dimethylaminostyryl) -4H-pyran, showing an intensity maximum at 590 nm.

Example 4

This example describes the construction of a simplified donor sheet which could be used to prepare the doped device made in Example 3. In this example the donor sheet is constructed by alternately depositing 100 Å thick layers of chromium followed by germanium onto an optically clear mica substrate as in Example 2 until a 400 Å stack is constructed. Onto this structure a doped EL medium is deposited. The host and dopants are molecularly engineered so that their vapor pressure/temperature profiles are similar. This can be accomplished by the attachment of pendant ballast groups to the higher vapor pressure material. This construction of the doped device will then follow the teaching of Example 2 but with the modified donor sheet.

Example 5

The utility of this process lies in its ability to deposit the evaporant in a patterned fashion, which is a necessity in the construction of a full color flat panel display. In order to make a full color display, three donor sheets must be constructed as described by Examples 3 or 4. The device is constructed as in Example 2. Patterning of the EL medium can be accomplished by exposing a donor sheet pixelwise with a highly focused light source or by exposing a large area of the donor sheet at the same time through a photo mask. Only the light source in the former or the mask in the latter method need be aligned to the receiver substrate. The donor sheet itself is not aligned and therefore a full color display can be produced by repetitively exposing three donor sheets, one for each of the primary colors.

Example 6

This example describes an alternative method using the close-spaced deposition technique to directly deposit the EL medium in a patterned fashion. The construction of the device proceeds in the same manner as in Example 2. The donor sheets follow the teachings of Examples 3 and 4 except all of the light absorbing metal layers present on the donor sheets are patterned in such a way so that there is a a 1 to 1 correspondence between the location of the metal on the donor sheet and the area on receiver sheet where the EL medium is to be deposited. Patterning is accomplished by first aligning the donor sheet to the receiver sheet and simply exposing the entire area. This process must be repeated for each different EL medium.

The invention has been described in detail with particular reference to preferred embodiments thereof, but it will be understood that variations and modifications can be effected within the spirit and scope of the invention.

Parts List

100 EL device
110 substrate
120 column electrodes
130 organic EL media
131 blue organic EL medium
132 green organic EL medium
133 red organic EL medium
140 row electrode
430 hole-injecting layer
440 hole-transporting layer
460 electron-transporting layer

What is claimed is:

1. A method of forming a full color organic electroluminescent display panel, comprising the steps of:
   (a) forming and patterning a transparent conductive layer to provide a plurality of spaced electrodes on a transparent substrate;
   (b) providing on the spaced electrodes, by close-spaced deposition from a donor sheet, blue, green, and red organic electroluminescent media to form adjacent colored subpixels which emit blue, green and red primary colors, respectively;
   (c) forming and patterning a conductive layer on the colored subpixels to provide a plurality of spaced electrodes; and
   (d) wherein the close-spaced deposition is provided by transferring to the transparent substrate each of the colored organic electroluminescent media by illuminating the respective donor sheet which is prepatterned with a light absorbing layer.

2. The method of claim 1 wherein the subpixels are formed in a two dimensional array of rows and columns and each separate subpixel is formed at the junction of each row and column.

3. The method of claim 1 wherein the red organic electroluminescent medium includes an organic light emitting host material and the red organic electroluminescent emitting dye, the green medium includes an organic light emitting host material and a green emitting dye, and the blue medium includes an organic light emitting host material and a blue emitting dye.

4. The method of claim 1 further including transferring the colored organic electroluminescent media from a donor sheet to the transparent substrate with a plurality of spaced electrodes; the separation between the donor sheet and the substrate during the close-spaced deposition process being in the range of direct contact between the donor sheet and the substrate to a dimension which is no greater than five times the pitch of the colored subpixel.

5. The method of claim 1 wherein the subpixels are formed in a two dimensional array of rows and columns and each separate subpixels is formed at the junction of each row and column.

6. A method of forming a multicolor organic electroluminescent display panel, comprising the steps of:
   (a) forming and patterning a transparent conductive layer to provide a plurality of spaced electrodes on a transparent substrate;
   (b) providing on the spaced electrodes, by close-spaced deposition, separately colored organic electroluminescent media from dye donor sheets to form colored subpixels;
   (c) providing on each donor sheet having a particular color of organic electroluminescent medium, a prepatterned light absorbing layer to form colored subpixels;
   (d) forming and patterning a conductive layer on the colored subpixels to provide a plurality of spaced electrodes; and
   (e) wherein the close-spaced deposition is provided by transferring to the transparent substrate each of the colored organic electroluminescent media by illuminating the respective donor sheet which is prepatterned with a light absorbing layer.

7. The method of claim 6 wherein the spacing between the donor sheet and the substrate during the close-spaced deposition is in the range of direct contact between the donor sheet and the substrate to a dimension which is no greater than five times the pitch of the colored subpixel.

* * * * *

UNITED STATES PATENT AND TRADEMARK OFFICE
CERTIFICATE OF CORRECTION

PATENT NO. : 5,688,551
DATED : 18 November 1997
INVENTOR(S) : Jon E. Littman, et al It is certified that error appears in the above-identified patent and that said Letters Patent is hereby corrected as shown below:

ON THE TITLE PAGE:  --Related U.S. Application Data--

Item [63]  --[60] Provisional Application No. 60/006,429 filed 13 November 1995.--

Column 1, line 3 please insert:

--CROSS REFERENCE TO RELATED APPLICATION

Reference is made to and priority claimed from U.S. Provisional Application Serial No. US 60/006,429 filed November 13, 1995, entitled METHOD OF FORMING AN ORGANIC ELECTROLUMINESCENT DISPLAY PANEL.--

Signed and Sealed this

Twelfth Day of May, 1998

Attest:

BRUCE LEHMAN

Attesting Officer    Commissioner of Patents and Trademarks